(12) United States Patent
Holmes

(10) Patent No.: US 6,434,077 B1
(45) Date of Patent: Aug. 13, 2002

(54) METHOD AND APPARATUS FOR SELECTIVELY DISABLING LOGIC IN A SEMICONDUCTOR DEVICE

(75) Inventor: Christopher M. Holmes, Carp (CA)

(73) Assignee: Mosaid Technologies, Inc., Kanata (CA)

( * ) Notice: Subject to any disclaimer, the term of this patent is extended or adjusted under 35 U.S.C. 154(b) by 0 days.

(21) Appl. No.: 09/804,988

(22) Filed: Mar. 13, 2001

(51) Int. Cl.$^7$ ................................................. G11C 8/00
(52) U.S. Cl. ..................................... 365/225.7; 365/201
(58) Field of Search ............................... 365/201, 225.7

(56) References Cited

U.S. PATENT DOCUMENTS 6,141,282 A * 10/2000 Chin et al. ................ 365/225.7
6,191,984 B1 * 2/2001 Noh ............................ 365/200
6,201,750 B1 * 3/2001 Busch et al. .............. 365/225.7

FOREIGN PATENT DOCUMENTS

JP 361126699 * 6/1986 ............ G11C/29/00

OTHER PUBLICATIONS

Betty Prince, "Semiconductor Memories", 1983, Wiley, 2$^{nd}$ Edition pp. 127–129.*

* cited by examiner

Primary Examiner—M. Tran
(74) Attorney, Agent, or Firm—Hamilton, Brook, Smith & Reynolds, P.C.

(57) ABSTRACT

A semiconductor device including an embedded memory and an Application Specific Integrated Circuit logic which is configured before the semiconductor device is packaged is presented. The Application Specific Integrated Circuit logic implements a plurality of functions. A fusible link in the embedded memory connected to one of the plurality of functions enables the function in the Application Specific Integrated Circuit. The function can be permanently disabled in the Application Specific Integrated Circuit by blowing the fusible link in the embedded memory while testing the embedded memory or after testing the embedded memory.

9 Claims, 4 Drawing Sheets

METHOD AND APPARATUS FOR SELECTIVELY DISABLING LOGIC IN A SEMICONDUCTOR DEVICE

BACKGROUND OF THE INVENTION

A system-on-a-chip ("SOC") semiconductor device often includes Application Specific Integrated Circuit ("ASIC") logic which implements a plurality of functions. However, all of the provided functions may not be required by all users of the semiconductor device.

Thus, multiple versions of the ASIC logic are typically designed, with a semiconductor device including ASIC logic implementing a subset of all the functions costing less than the semiconductor device including ASIC logic which implements all the functions. Designing multiple versions of the ASIC logic ensures that a user cannot purchase a cheaper version of the semiconductor device and later modify the semiconductor device to create the more expensive semiconductor device which includes the ASIC logic which implements all the functions. However, designing multiple versions of ASIC logic is expensive.

SUMMARY OF THE INVENTION

Multiple configurations of a semiconductor device can be provided from the same physical semiconductor device on a same die. The configuration of the semiconductor device is selected while the accessible memory in the semiconductor device is being tested or after the accessible memory is tested. Once testing and configuration is complete, the semiconductor device is packaged and no further configuration change is possible.

A method and apparatus for configuring logic in a semiconductor device is presented. The semiconductor device includes logic for performing a function and a fuse circuit in an embedded memory. The fuse circuit is coupled to the logic. The fuse circuit has a first state and a second state. The logic is permanently disabled upon transition of the fuse circuit from the first state to the second state.

The fuse circuit is associated with embedded memory fuses. The fuse circuit transitions from the first state to the second state while the embedded memory is being tested or after the embedded memory has been tested.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of preferred embodiments of the invention follows.

A system-on-a-chip ("SOC") semiconductor device can include Application Specific Integrated Circuit (ASIC) logic and an embedded memory. The embedded memory includes memory elements arranged in rows and columns. Each memory element in the embedded memory is identified by a column address for selecting a column and a row address for selecting a row.

The memory elements in the embedded memory are tested before the semiconductor device is packaged. The embedded memory includes redundant memory elements which can be used to replace defective memory elements. Typically, in the case of column redundancy, if a defective memory element is detected in a particular column, the entire column of memory elements is replaced by a redundant column of memory elements.

The column including the defective memory element is replaced by a redundant column of memory elements through the use of fusible links (more commonly referred to as fuses) which can be "blown" as needed using laser or other technologies. The memory device is packaged after the memory elements have been tested and fuses have been blown if necessary. After the memory device is packaged, the state of the fuse circuitry can no longer be changed.

Figure 1:
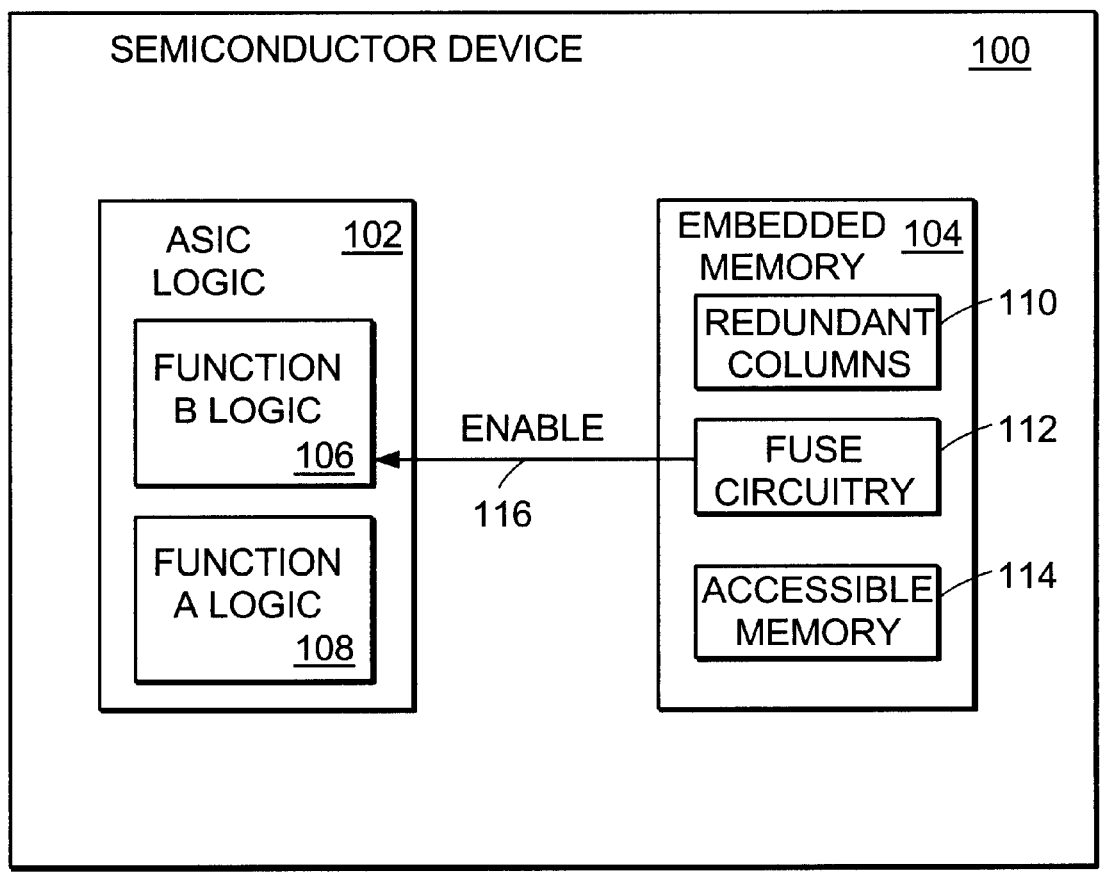
FIG. 1 illustrates a semiconductor device including an embedded memory and Application Specific Integrated Circuit ("ASIC") logic.

FIG. 1 illustrates a semiconductor device 100 including an embedded memory 104 and an Application Specific Integrated Circuit ("ASIC") logic 102. The embedded memory 104 includes accessible memory 114, fuse circuitry 112 and redundant columns 110. The accessible memory 114 includes memory elements arranged in rows and columns.

The memory elements in the accessible memory 114 are tested before the semiconductor device 100 is packaged. If any memory element in the accessible memory 114 fails, the entire column of memory elements which includes the failed memory element is replaced by a redundant column of memory elements from the redundant columns 110. The defective column in the accessible memory 114 is replaced by a column in the redundant columns 110 by blowing selected fuses in the fuse circuitry 112 and thereby enabling a redundant column address path while disabling the faulty normal column address path.

The fuses in the fuse circuitry 112 are blown using a laser beam or other energy source under control of the test program before the semiconductor device 110 is packaged and cannot be altered after packaging. The use of redundant columns 110 to replace a defective element in accessible memory 114 and methods for blowing fuses in a memory device are well-known to those skilled in the art.

The ASIC 102 includes logic for performing a plurality of functions. Logic circuits for performing function A and function B are shown. Function A logic 108 is permanently enabled. Function B logic 106 is enabled or disabled dependent on the state of an enable signal 116 controlled by a fuse circuitry 112. The fuse circuitry 112 is in the embedded memory 104 and coupled to the ASIC logic 102 to control Function B logic 106 in the ASIC logic 102

The semiconductor device 100 is manufactured with the state of the enable signal 116 set to "ENABLE" to provide a semiconductor device 100 with both function A logic and function B logic enabled. During testing of the embedded memory function B logic can be disabled to provide the semiconductor device 100 with only function A logic 108 dependent on a customer's order requirement. In one embodiment the semiconductor device 100 is for an Ethernet switch. The function A logic 108 implements "layer 2" mode logic for switching data packets and function B logic 106 implements "layer 3" mode logic for switching data packets.

The semiconductor device for the Ethernet switch is designed for both "layer 2" mode and "layer 3" mode and manufactured with both "layer 2" mode and "layer 3" mode logic enabled. A semiconductor device for an Ethernet switch with only "layer 2" mode switching is provided during the testing of the embedded memory in the semiconductor device for the Ethernet switch by disabling the "layer 3" mode logic. By including both function A logic as well as function B logic on the same device and providing a way of selectively enabling each functional block, all devices allocated to different customers with different requirements can be manufactured simultaneously, thereby saving significant manufacturing costs.

Figure 2A:
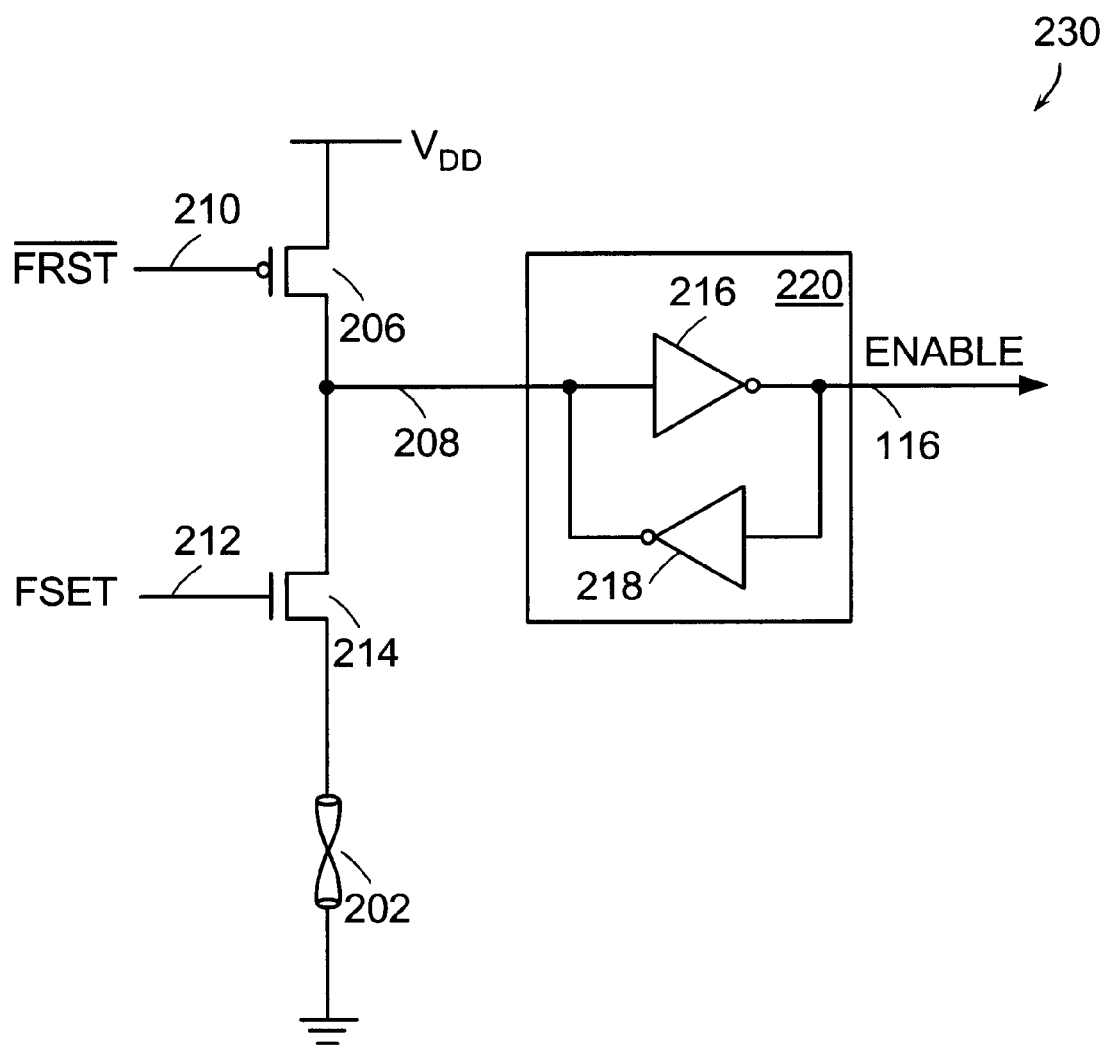
FIG. 2A illustrates an embodiment for one of the fuse latch circuits in the fuse circuitry in the embedded memory shown in FIG. 1.

FIG. 2A illustrates an embodiment for one of the fuse latch circuits in the fuse circuitry 112 in the embedded memory 104. This is a well-known fuse latch circuit to those skilled in the art. The logic state of an enable signal 116 after initialization of the device is dependent on whether a fuse 202 is intact or blown.

If the fuse 202 is intact, PMOS transistor 206 is turned on by an "active-low" fuse enable pulse signal /FRST that is derived from a power-up signal upon initialization of the device and as a result, node 208 is logic 'H'. The /FRST signal is normally logic 'H' and is pulsed to logic 'L' for a predetermined time interval. An inverter 216 in a latch 220 receives logic 'H' on input and generates logic 'L' on the enable signal 116. A feedback inverter 218 in the latch 220 receives logic 'L' from output of inverter 216 and provides a logic 'H' on node 208 thereby latching the enable signal 116 in logic 'L' state and the fuse pulse enable signal /FRST can return to a logic 'H' standby state.

At some predetermined time later, after the fuse enable pulse signal /FRST has returned to logic 'H', a fuse set signal FSET 212 is applied to NMOS transistor 214. Since the fuse 202 is intact, a path to ground from node 208 through transistor 214 and the fuse 202 exists, pulling the input to the latch 220, that is, node 208 to logic 'L' and thereby generating logic 'H' output on enable signal 116. It is noted that for optimum operation, inverter 218 in the latch 220 is selected to have a higher resistance than inverter 216, thereby allowing pull down of node 208 as previously described. Since the latch 220 is a full latch; that is, consisting of two cross-coupled inverters, the fuse signal FSET 212 can also be a pulse.

If fuse 202 is blown, PMOS transistor 206 is turned on by a fuse enable pulse signal /FRST that is derived from a power-up signal upon initialization of the device and as a result, node 208 is logic 'H'. Inverter 216 receives logic 'H' on input and generates a logic 'L' on enable signal 116. The feedback inverter 218 in the latch 220 receives logic 'L' from the output of inverter 216 and provides a logic 'H' on node 208, thereby latching the enable signal 116 in logic 'L' state and the fuse enable pulse signal /FRST can return to a logic 'H' standby state.

At some predetermined time later, after the fuse enable pulse signal /FRST has returned to logic 'H', a fuse set signal FSET 212 is applied to NMOS transistor 214. Since the fuse 202 is blown, no path exists between node 208 and ground and therefore the latch 220 remains latched in the reset state, that is, output logic 'L' and enable signal 16 is logic 'L'.

Thus, multiple configurations of the semiconductor device 100 can be provided from the same physical semiconductor device 100 on a same die. The configuration of the semiconductor device 100 is selected while the accessible memory 114 in the semiconductor device 100 is being tested or after the accessible memory 114 is tested. Once testing and configuration is complete, the semiconductor device 100 is packaged and no further configuration change is possible.

This allows a single full-function semiconductor device 102 to be designed instead of designing completely different semiconductor devices. The enable signal 116 is an internal configuration signal which can only be modified during testing of the semiconductor device 100 by a manufacturer, before the semi-conductor device 100 is packaged.

The internal enable signal 116 is non-volatile and not configurable after the device is packaged so that customers can not purchase a semiconductor device 100 with only function A logic enabled and later modify the semiconductor device 100 to enable function B logic. An embedded memory test program is configured so that the fuse 202 is not blown to provide a semiconductor device 100 with both function A logic and function B logic enabled in the ASIC logic 102, and the fuse is blown to produce a semiconductor device 100 with only function A logic enabled.

Figure 2B:
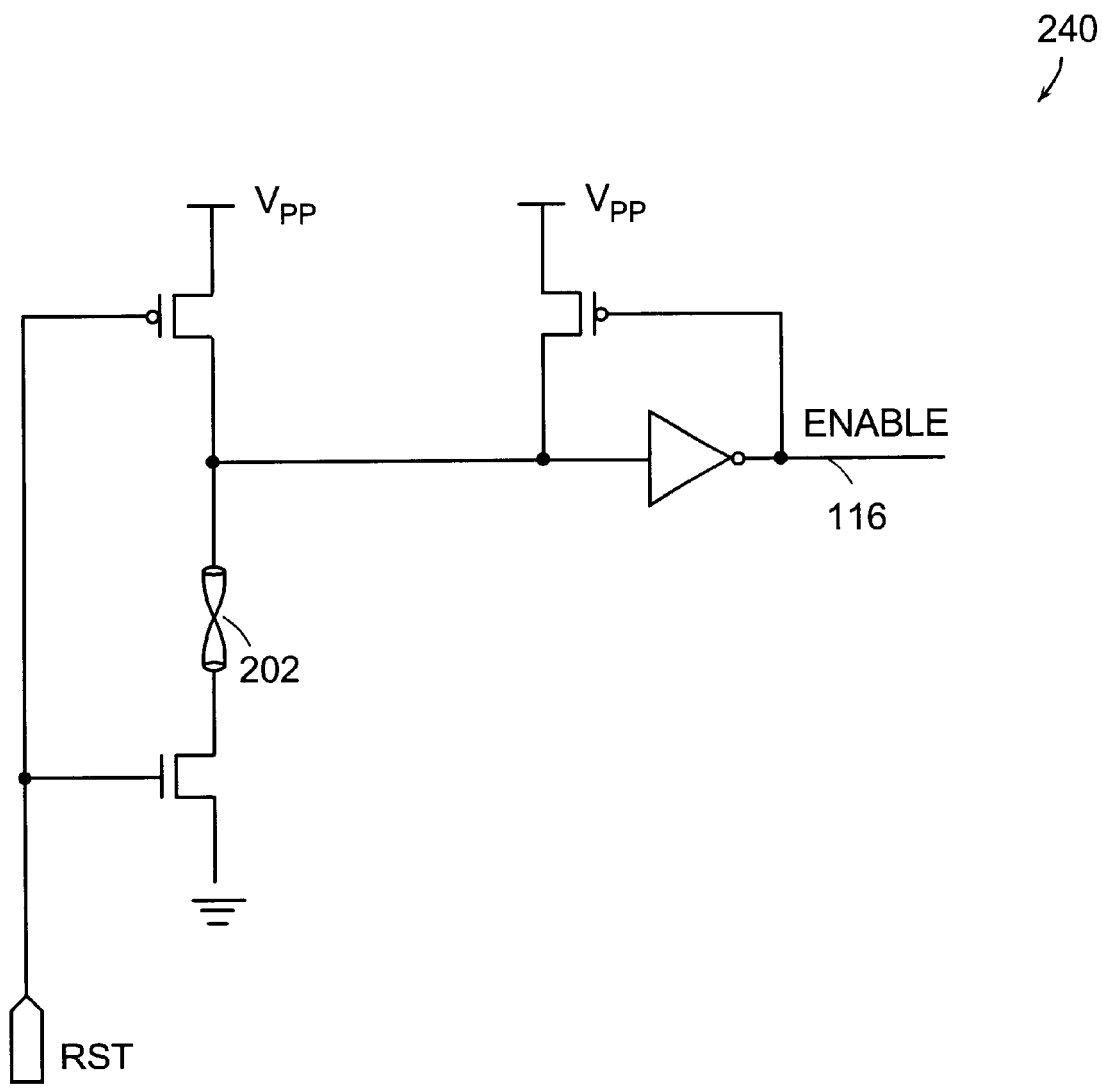
FIG. 2B illustrates another embodiment for one of the fuse latch circuits in the fuse circuitry in the embedded memory shown in FIG. 1.

FIG. 2B illustrates another embodiment for one of the fuse latch circuits in the fuse circuitry 112 in the embedded memory 104. Fuse latch circuit 240 is described in U.S. Pat. No. 6,141,268 issued on Oct. 31, 2000 entitled "Column Redundancy in Semiconductor Memories" by Chen et al., assigned to the same assignee as the present invention, and is incorporated herein by reference in its entirety.

Figure 3:
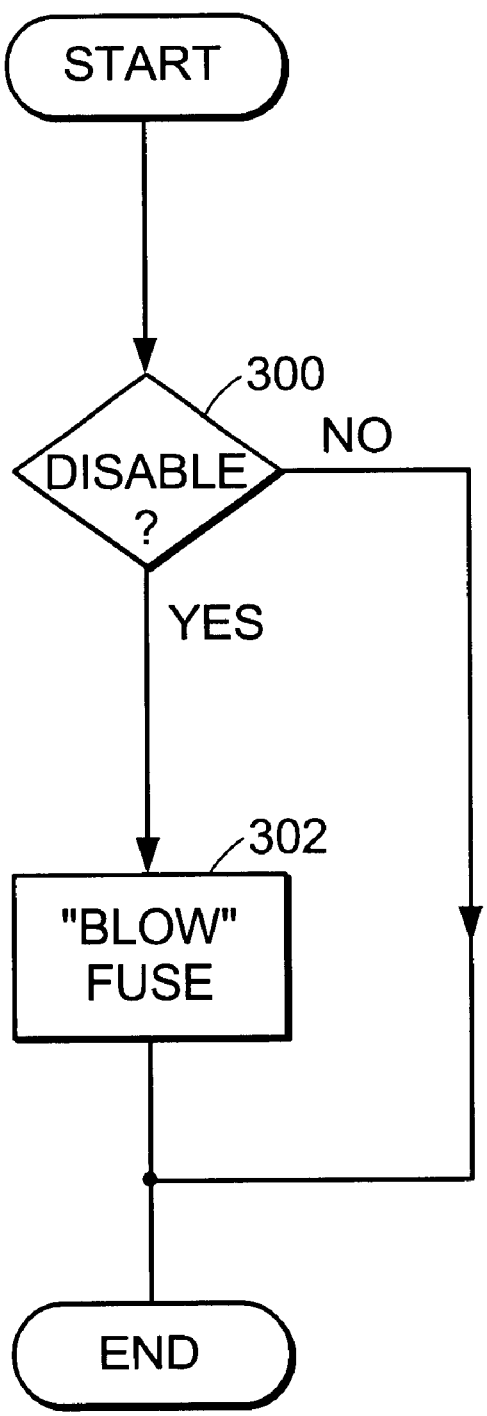
FIG. 3 is a flow chart illustrating the method for configuring the semiconductor device shown in FIG. 1.

FIG. 3 is a flow chart illustrating the method for configuring the semiconductor device 100 shown in FIG. 1 while the embedded memory 104 (FIG. 1) is being tested. FIG. 3 is described in conjunction with the embodiment of the fuse latch circuit 230 shown in FIG. 2A. A test program for testing the embedded memory 104 is configured to blow the fuse 202 (FIG. 2A) or leave the fuse 202 (FIG. 2A) intact dependent on the required configuration of the semiconductor device 100 (FIG. 1). If a particular function is to be disabled, the fuse is blown.

At step 300, the executing test program determines if the selected configuration of the semiconductor device 100 requires that the particular function be disabled. If so, processing continues with step 302. If not, processing is complete.

At step 302, the test program blows the fuse 202 (FIG. 2A). The fuse 202 (FIG.2) is blown using a laser beam under control of the test program. After the fuse is blown, processing is complete.

After the test program has completed execution, the semiconductor device 100 (FIG. 1) is packaged. The state of the fuse 202 (FIG. 2A) cannot be altered after the semiconductor device 100 (FIG. 1) is packaged.

While this invention has been particularly shown and described with references to preferred embodiments thereof, it will be understood by those skilled in the art that various changes in form and details may be made therein without departing from the scope of the invention encompassed by the appended claims.

What is claimed is:

1. A semiconductor device comprising:
   a logic circuit for performing a logic function; and
   a fuse circuit in an embedded memory, the fuse circuit coupled to the logic for selectively controlling the logic circuit, the fuse circuit having a first state and a second state, the logic circuit being permanently disabled upon transition of the fuse circuit from the first state to the second state wherein the fuse circuit comprises an embedded memory fuse circuit.

2. The semiconductor device as claimed in claim 2 wherein the state of the fuse circuit transitions from the first state to the second state while the embedded memory is being tested.

3. The semiconductor device as claimed in claim 1 wherein the state of the fuse circuit transitions from the first state to the second state after the embedded memory is tested.

4. A method for configuring a semiconductor device comprising the steps of:

provididing a logic for performing a logic function;

providing a fuse circuit in an embedded memory, the fuse circuit coupled to the logic for selectively disabling the logic function, the fuse circuit having a first state and a second state; and permanently disabling the logic upon transition of the fuse circuit from the first state to the second state wherein the fuse circuit comprises an embedded memory fuse circuit.

5. The method for configuring a semiconductor device as claimed in claim 4 wherein the state of the fuse circuit transitions from the first state to the second state while the embedded memory is being tested.

6. The method for configuring a semiconductor device as claimed in claim 4 wherein the state of the fuse circuit transitions from the first state to the second state after the embedded memory is tested.

7. A semiconductor device comprising:

logic means for performing a logic function; and a fuse circuit means in an embedded memory for selectively disabling the logic means, the fuse circuit means coupled to the logic means, the fuse circuit means having a first state and a second state, the logic means being permanently disabled upon transition of the fuse circuit from the first state to the second state wherein the fuse circuit means comprises an embedded memory fuse circuit.

8. The semiconductor device of claim 7 wherein the fuse circuit means transitions from the first state to the second state while the embedded memory is being tested.

9. The semiconductor device of claim 7 wherein the fuse circuit means transitions from the first state to the second state after the embedded memory is tested.

* * * * *